(12) United States Patent
Manna et al.

(10) Patent No.: US 9,583,332 B2
(45) Date of Patent: Feb. 28, 2017

(54) LOW TEMPERATURE CURE MODULUS ENHANCEMENT

(71) Applicant: Applied Materials, Inc., Santa Clara, CA (US)

(72) Inventors: Pramit Manna, Santa Clara, CA (US); Kiran V. Thadani, Sunnyvale, CA (US); Abhijit Basu Mallick, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 86 days.

(21) Appl. No.: 14/590,624

(22) Filed: Jan. 6, 2015

(65) Prior Publication Data

US 2015/0214039 A1 Jul. 30, 2015

Related U.S. Application Data

(60) Provisional application No. 61/933,158, filed on Jan. 29, 2014.

(51) Int. Cl.
*H01L 21/31* (2006.01)
*H01L 21/469* (2006.01)
(Continued)

(52) U.S. Cl.
CPC ...... *H01L 21/02164* (2013.01); *C23C 16/402* (2013.01); *C23C 16/56* (2013.01);
(Continued)

(58) Field of Classification Search
CPC ......... H01L 21/02126; H01L 21/02164; H01L 21/02274; H01L 21/02337; H01L 21/0234; H01L 21/31612
(Continued)

(56) References Cited

U.S. PATENT DOCUMENTS 6,784,119 B2   8/2004  Xia et al.
7,288,292 B2   10/2007 Gates et al.
(Continued)

OTHER PUBLICATIONS

International Search Report and Written Opinion for International Application No. PCT/US2015/010323 dated Apr. 21, 2015.

*Primary Examiner* — Kyoung Lee
*Assistant Examiner* — Joannie A Garcia
(74) *Attorney, Agent, or Firm* — Patterson + Sheridan, LLP (57) ABSTRACT

Implementations described herein generally relate to methods for dielectric gap-fill. In one implementation, a method of depositing a silicon oxide layer on a substrate is provided. The method comprises introducing a cyclic organic siloxane precursor and an aliphatic organic siloxane precursor into a deposition chamber, reacting the cyclic organic siloxane precursor and the aliphatic organic siloxane precursor with atomic oxygen to form the silicon oxide layer on a substrate positioned in the deposition chamber, wherein the substrate is maintained at a temperature between about 0° C. and about 200° C. as the silicon oxide layer is formed, wherein the silicon oxide layer is initially flowable following deposition, and wherein a ratio of a flow rate of the cyclic organic siloxane precursor to a flow rate of the aliphatic organic siloxane precursor is at least 2:1 and curing the deposited silicon oxide layer.

19 Claims, 4 Drawing Sheets

(51) Int. Cl.
*H01L 21/02* (2006.01)
*H01L 21/687* (2006.01)
*C23C 16/40* (2006.01)
*C23C 16/56* (2006.01)
*H01J 37/32* (2006.01)

(52) U.S. Cl.
CPC .. *H01J 37/32449* (2013.01); *H01L 21/02216* (2013.01); *H01L 21/02274* (2013.01); *H01L 21/02348* (2013.01); *H01L 21/02351* (2013.01); *H01L 21/68742* (2013.01); *H01L 21/68792* (2013.01)

(58) Field of Classification Search
USPC ......... 438/99, 562, 623, 723, 743, 756, 780, 438/781, 787–790, 913, 935, FOR. 135, 438/FOR. 323, FOR. 398
See application file for complete search history.

(56) References Cited

U.S. PATENT DOCUMENTS

| | | |
|---|---|---|
| 7,504,727 B2 | 3/2009 | Fuller et al. |
| 7,902,080 B2 | 3/2011 | Chen et al. |
| 8,318,584 B2 | 11/2012 | Li et al. |
| 8,404,583 B2 | 3/2013 | Hua et al. |
| 8,481,403 B1 | 7/2013 | Gauri et al. |
| 8,569,166 B2 | 10/2013 | Schmitt et al. |
| 8,580,697 B1 | 11/2013 | Lang et al. |
| 2003/0194495 A1 | 10/2003 | Li et al. |
| 2005/0186731 A1 | 8/2005 | Derderian et al. |
| 2007/0281106 A1* | 12/2007 | Lubomirsky .......... C23C 16/401 427/569 |
| 2007/0281495 A1 | 12/2007 | Mallick et al. |
| 2008/0085607 A1 | 4/2008 | Yu et al. |
| 2009/0104790 A1 | 4/2009 | Liang |
| 2009/0120368 A1* | 5/2009 | Lubomirsky ....... C23C 16/4409 118/733 |

* cited by examiner

FIG. 4

LOW TEMPERATURE CURE MODULUS ENHANCEMENT

CROSS-REFERENCE TO RELATED APPLICATIONS

This application claims benefit of U.S. provisional patent application Ser. No. 61/933,158, filed Jan. 29, 2014. The aforementioned related patent application is incorporated by reference herein in its entirety.

BACKGROUND

Field

Implementations described herein generally relate to methods for dielectric gap-fill. More specifically, the methods provide bottom-up gap-fill of dielectrics by forming a flowable film in the gaps on a substrate.

Description of the Related Art

Many deposition processes have difficulty filling the small trenches and other gap features used in current semiconductor processing schemes. Individual trenches and other gap type features produced in any given technology node have principal dimensions that are significantly smaller than the critical dimensions that define the current technology. Thus, it is not unusual to find gaps on the order of 100 nm or less. In future years, these feature sizes will shrink to even smaller dimensions. Unless the processes are extremely conformal, the gaps pinch off at their necks. Compounding the problem is the fact that many of these gaps have relatively high aspect ratios, on the order of at least 6:1. Examples of situations where one can find these dimensions and geometries include damascene copper line processes, shallow trench isolation, and interlayer dielectric (ILD) applications.

Filling such trenches in a reliable manner, while avoiding voids in the fill material is particularly challenging at this scale. Current processes including Physical Vapor Deposition (PVD) and Plasma Enhanced Chemical Vapor Deposition (PECVD), including High Density Plasma Chemical Vapor Deposition (HDP CVD), each of which presents some issues for filling small dimension, high aspect ratio features. Conformal deposition techniques may be inappropriate for situations where the dimension of the neck is narrower than the rest of the feature. This is because the conformal nature of the deposition leads to "pinching off", where the reentrant features are not completely filled before the entrance to the feature is sealed off. In addition, conformal deposition often leads to weak spots or seams in structures with vertical walls.

Therefore, improved deposition techniques for creating void free fill in very narrow dimension features is needed.

SUMMARY

Implementations described herein generally relate to methods for dielectric gap-fill. More specifically, the methods provide bottom-up gap-fill of dielectrics by forming a flowable film in the gaps on a substrate. In one implementation, a method of depositing a silicon oxide layer on a substrate is provided. The method comprises introducing a cyclic organic siloxane precursor and an aliphatic organic siloxane precursor into a deposition chamber, reacting the cyclic organic siloxane precursor and the aliphatic organic siloxane precursor with atomic oxygen to form the silicon oxide layer on a substrate positioned in the deposition chamber, wherein the substrate is maintained at a temperature between about 0° C. and about 200° C. as the silicon oxide layer is formed, wherein the silicon oxide layer is initially-flowable following deposition, and wherein a ratio of a flow rate of the cyclic organic siloxane precursor to a flow rate of the aliphatic organic siloxane precursor is at least 2:1 and curing the deposited silicon oxide layer.

In another implementation, a method of depositing a silicon oxide layer on a substrate is provided. The method comprises generating atomic oxygen outside a deposition chamber and introducing the atomic oxygen into the deposition chamber, introducing a cyclic organic siloxane precursor and an aliphatic organic siloxane precursor into the deposition chamber, wherein the cyclic organic siloxane precursor and the aliphatic organic siloxane precursor are first mixed with the atomic oxygen within the deposition chamber, reacting the cyclic organic siloxane precursor, the aliphatic organic siloxane precursor and the atomic oxygen to form the silicon oxide layer on a substrate positioned in the deposition chamber, wherein the substrate is maintained at a temperature between about 0° C. and about 200° C. as the silicon oxide layer is formed, wherein the silicon oxide layer is initially-flowable following deposition, wherein a ratio of a flow rate of the cyclic siloxane precursor to a flow rate of the aliphatic siloxane precursor is at least 2:1 and curing the deposited silicon oxide layer.

The features, functions, and advantages that have been discussed can be achieved independently in various implementations or may be combined in yet other implementations, further details of which can be seen with reference to the following description and drawings.

BRIEF DESCRIPTION OF THE DRAWINGS

So that the manner in which the a above-recited features of the present disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures. It is contemplated that elements disclosed in one implementation may be beneficially used on other implementations without specific recitation.

DETAILED DESCRIPTION

The following disclosure describes processes and compositions for the deposition of flowable films and devices for carrying out the aforementioned process. Certain details are set forth in the following description and in FIGS. 1-4 to provide a thorough understanding of various implementations of the disclosure. Other details describing well-known methods and systems often associated with the deposition of flowable films are not set forth in the following disclosure to avoid unnecessarily obscuring the description of the various implementations.

Many of the details, components and other features described herein are merely illustrative of particular implementations. Accordingly, other implementations can have other details, components, and features without departing from the spirit or scope of the present disclosure. In addition, further implementations of the disclosure can be practiced without several of the details described below.

As used herein, the following terms have the meaning set forth below unless otherwise stated or clear from the context of their use.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

The term "precursor" is used to refer to any process gas, which takes part in a reaction to either remove material from or deposit material onto a surface.

The term "substrate" refers to a support substrate with or without layers formed thereon. The support substrate may be an insulator or semiconductor of a variety of doping concentrations and profiles and may be, for example, a semiconductor substrate of the type used in the manufacture of integrated circuits.

A layer of "silicon oxide" may include minority concentrations of other elemental constituents such as nitrogen, hydrogen, carbon and the like. In some implementations, silicon oxide consists essentially of silicon and oxygen.

The phrase "inert gas" refers to any gas which does not form chemical bonds when etching or being incorporated into a film. Exemplary inert gases include noble gases but may include other gases so long as no chemical bonds are formed when (typically) trace amounts are trapped in a film.

Implementations described herein relate to filling gaps on substrates with a solid dielectric material by forming a flowable film in the gap. The flowable film provides consistent, void-free gap fill. The film is then converted to a solid dielectric material. In this manner gaps on the substrate are filled with the solid dielectric material. According to various implementations, the methods involve reaction of a cyclic siloxane precursor and an aliphatic siloxane precursor with an oxidant to form the dielectric material. In certain implementations, the dielectric precursor condenses and subsequently reacts with the oxidant to form dielectric material. In other implementations, vapor phase reactants react to form a condensed flowable film.

Implementations described herein may be performed on deposition systems that may include high-density plasma chemical vapor deposition (HDP-CVD) systems, plasma enhanced chemical vapor deposition (PECVD) systems, sub-atmospheric chemical vapor deposition (SACVD) systems, and thermal chemical vapor deposition systems, among other types of systems. Specific examples of CVD systems that may implement the implementations described herein include the CENTURA® ULTIMA HDP-CVD chambers/systems, and PRODUCER® chambers/systems, available from Applied Materials, Inc. of Santa Clara, Calif.

In general, flow rate of gas mixtures to a process chamber will depend on the size of the substrate being processed. Flow rates described herein are typically based on a 300 mm diameter substrate in an appropriately sized chamber.

Figure 1:
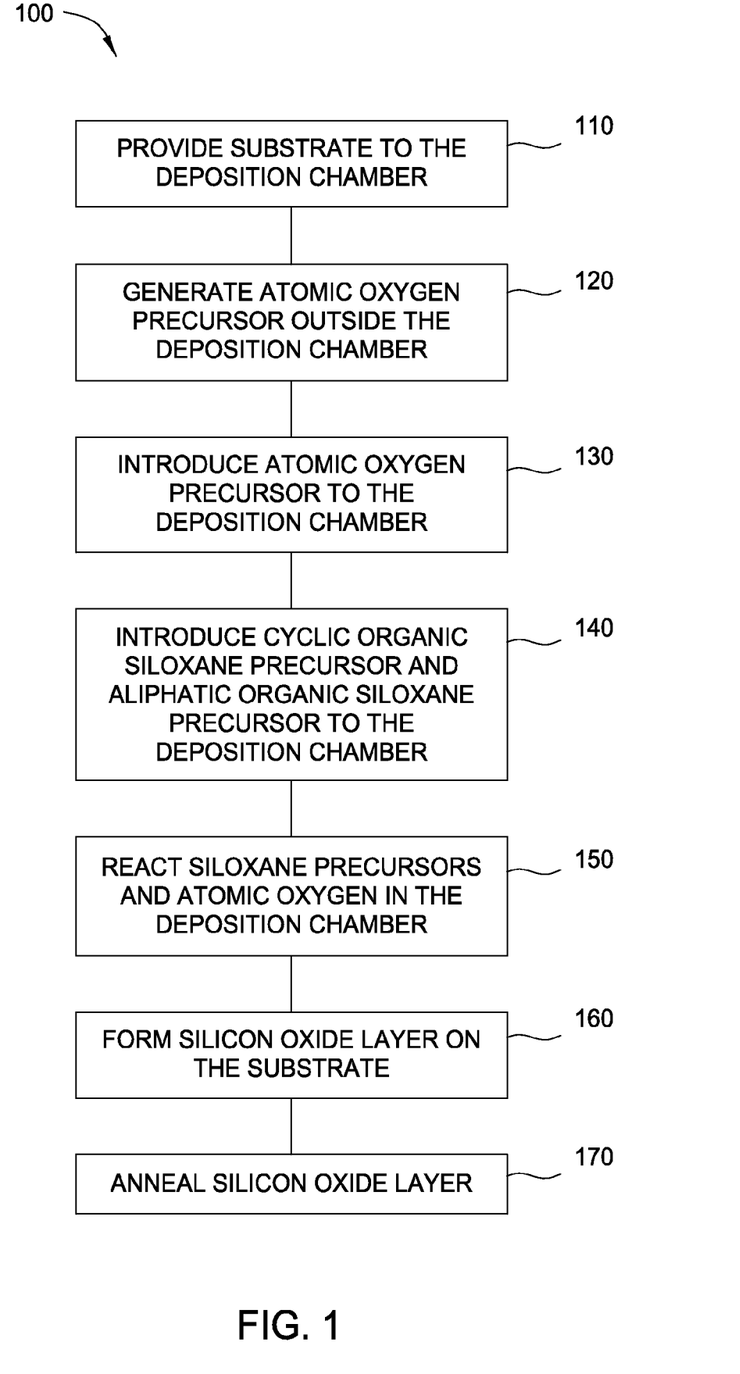
FIG. 1 is a process flow diagram illustrating one implementation of a method for depositing a flowable film according to implementations described herein.

FIG. 1 is a process flow diagram illustrating one implementation of a method 100 for depositing a flowable film according to implementations described herein. At block 110, the method 100 includes providing a substrate to a deposition chamber, for example, deposition chamber 400. The substrate may be a semiconductor wafer (e.g., silicon wafer having a diameter of about 300 mm or less; a silicon wafer with a diameter of about 100 mm, 150 mm, 200 mm, 300 mm, 400 mm, etc.) and may include structures, device components, etc., formed in earlier processes. For example, the substrate may include gaps, trenches, vias, etc., with high height to width aspect ratios (e.g., an aspect ratio of 5:1 or more, 6:1 or more, 7:1 or more, 8:1 or more, 9:1 or more, 10:1 or more, 11:1 or more, 12:1 more, etc.).

At block 120, the method 100 also includes the remote generation of an atomic oxygen precursor at a location outside the deposition chamber. The atomic oxygen may be generated by the dissociation of an oxygen containing precursor such as molecular oxygen ($O_2$), ozone ($O_3$), a nitrogen-oxygen compound (e.g., NO, $NO_2$, $N_2O$, etc.), a hydrogen-oxygen compound (e.g., $H_2O$, $H_2O_2$, etc.), a carbon-oxygen compound (e.g., CO, $CO_2$, etc.), as well as other oxygen containing precursors and combinations of precursors.

The dissociation of the oxygen containing precursor to generate the atomic oxygen may be done by thermal dissociation, ultraviolet light dissociation, and/or plasma dissociation, among other methods. Plasma dissociation may involve striking a plasma from gases such as helium, argon, hydrogen ($H_2$), xenon, ammonia ($NH_3$), and combinations thereof in a remote plasma generating chamber and introducing the oxygen precursor to the plasma to generate the atomic oxygen precursor.

The atomic oxygen may be generated in a remote high-density plasma generator supplying 4,000 to 6,000 Watts (e.g., 5,500 Watts) of RF power to a combined gas stream of argon gas flowing at, for example, about 900 to 1,800 sccm with molecular oxygen ($O_2$) flowing at, for example, about 600 to about 1,200 sccm.

At block 130, the reactive atomic oxygen plasma is then introduced to the deposition chamber where it may mix for the first time with organic siloxane precursors, which are also introduced to the deposition chamber at block 140. At block 150, the highly reactive atomic oxygen will react with the organic siloxane precursors (and other deposition precursors that may be present in the reaction chamber) at moderate temperatures (e.g., reaction temperatures less than 200° C.; reaction temperatures less than 150° C.; reaction temperatures less than 100° C.; between about 0° C. to 200° C.; reaction temperatures between about 50° C. to 150° C.; reaction temperatures between about 50° C. to 100° C.) and pressures (e.g., about 0.1 Torr to about 10 Torr; 0.5 to 6 Torr; 0.5 to 3 Torr total chamber pressure) to form a silicon oxide film. During deposition, the wafer may be adjusted (i.e., heated or cooled) by a wafer pedestal that supports the wafer to a temperature of about 0° C. to about 200° C. (e.g., a temperature of about 0° C. to about 150° C.; a temperature of about 50° C. to about 100° C.).

In some implementations, the reactive atomic oxygen plasma may be formed in-situ.

Exemplary cyclic organic siloxane precursors include octamethyltrisiloxane (OMTS), octamethylcyclotetrasiloxane (OMCTS), tetramethylcyclotetrasiloxane (TMCTS) and combinations thereof.

Exemplary aliphatic organic siloxane precursors include tetramethylorthosilicate (TMOS), tetraethylorthosilicate (TEOS), trimethylmethoxysilane (TMMOS), tetramethyldimethyldimethoxydisilane, dimethyldimethoxysilane (DMDMOS), dimethyldiethoxysilane (DMDEOS), diethoxymethylsilane (DEMS), methyl triethoxysilane (MTEOS), methyl trimethoxysilane (MTMOS), and combinations thereof.

The organic siloxane precursors may be mixed with a carrier gas before or during introduction to the deposition chamber. The carrier gas may be an inert gas that does not unduly interfere with the formation of the oxide film on the substrate. Examples of carrier gases include helium, neon, argon, nitrogen ($N_2$), and hydrogen ($H_2$), among other gases. For example, for a 300 mm circular substrate, helium may be bubbled at a flow rate of about 600 to about 2,400 sccm through a room-temperature liquid organosilicon precursor such as OMCTS to provide a flow of OMCTS to the chamber at a rate of about 800 to about 1,600 mgm. In some implementations, the carrier gas may be introduced at a flow rate between about 1,000 sccm to about 10,000 sccm.

In some implementations for a 300 mm circular substrate the cyclic organic siloxane precursors may be introduced at a flow rate between about 500 sccm and about 3,000 sccm (e.g., between about 1,200 sccm and about 2,400 sccm; between about 1,600 sccm and about 2,000 sccm). In some implementations for a 300 mm circular substrate the aliphatic organic siloxane precursors may be introduced at a flow rate between about 100 sccm and about 3,000 sccm (e.g., between about 600 sccm and about 1,200 sccm; between about 800 sccm and about 1,000 sccm).

In some implementations, a ratio of a flow rate of the cyclic organic siloxane precursor to a flow rate of the aliphatic organic siloxane precursor is at least 2:1 (e.g., between 2:1 to 100:1; between 2:1 to 20:1; between about 2:1 to 6:1).

In implementations where the atomic oxygen and organic siloxane precursors are not mixed before being introduced to the deposition chamber. The precursors may enter the chamber through separate spatially separated precursor inlets distributed around reaction chamber. For example, the atomic oxygen precursor may enter from an inlet (or inlets) at the top of the chamber and positioned directly above the substrate. The inlet directs the flow of the oxygen precursor in a direction perpendicular to the substrate deposition surface. Meanwhile, the organic siloxane precursors may enter from one or more inlets around the sides of the deposition chamber. The inlets may direct the flow of the silicon precursor in a direction approximately parallel to the deposition surface.

Additional implementations include sending the atomic oxygen and organic siloxane precursors through separate ports of a multi-port showerhead. For example, a showerhead positioned above the substrate may include a pattern of openings for the precursors to enter the deposition chamber. One subset of openings may be supplied by the atomic oxygen precursor, while a second subset of openings is supplied by the organic siloxane precursors. Precursors traveling through different sets of opening may be fluidly isolated from each other until exiting into the deposition chamber. Additional details about types and designs of precursor handling equipment is described in commonly assigned U.S. Non-Provisional Application with Ser. No. 11/754,858, titled "PROCESS CHAMBER FOR DIELECTRIC GAPFILL", and now published as US2007-0289534.

In some implementations, the organic siloxane precursors are mixed prior to entering the process region of the chamber.

At block 160, as the atomic oxygen and organic siloxane precursors react in the deposition chamber, they form the silicon oxide layer on the substrate deposition surface. The initial oxide layer has excellent flowability, and can quickly migrate into gaps, trenches, vias, voids, seams, etc., in the structures present at the deposition surface. This allows the method 100 to provide oxide fills that are substantially free of voids and seams in gaps, trenches, and other surface structures that have high height to width aspect ratios (e.g., aspect ratios of about 5:1, 6:1, 6:1, 8:1, 9:1, 10:1, 11:1, and 12:1 or more).

Because the atomic oxygen is highly reactive, the deposition temperature in the reaction chamber may be relatively low (e.g., about 100° C. or less). Oxide deposition rates may range from about 2,000 Å/min to about 10,000 Å/min (e.g., about 2,500 Å/min to about 9,500 Å/min; about 3,000 Å/min to about 7,000 Å/min, etc.). The thickness of the layer may be about 50 Å to about 500 Å (e.g., about 50 Å to about 300 Å; about 100 Å to about 200 Å).

At block 170, following the formation of the silicon oxide layer (and any additional oxide layers) the oxide layers may be annealed to form a uniform, high-quality silicon oxide gapfill. The final gapfill may have a dielectric constant (i.e., k-value) of less than 4.0 (e.g., less than about 3.2; less than about 3.1, less than about 3.0, etc.), and a modulus of about 10 GPa or greater (e.g., 14 GPa or greater, 16 GPa or greater, or 20 GPa). The gapfill may be uniform throughout the fill volume, and contain few, if any, voids or seams.

Exemplary deposition conditions are depicted in Table 1.

TABLE I

| Temp (° C.) | TMOS (sccm) | OMCTS (sccm) | $O_2$ (sccm) | He (sccm) | Pressure (Torr) | Deposition Rate (Å/min) |
| --- | --- | --- | --- | --- | --- | --- |
| 50-100 | 100-3,000 | 500-3,000 | 1,000-5,000 | 1,000-10,000 | 0.5-3T | 2000-10,000 |

While not wishing to be bound to a particular theory, it is believed that the silicon precursor and the remotely generated atomic oxygen react to form a silicon oxide that has a high concentration of silicon-hydroxyl group (Si—OH) bonds. It is believed that these bonds impart the increased flowability to the silicon oxide layer. The Si—OH bonds, however, also increase the wet etch rate ratio (WERR) and dielectric constant of the deposited layer, which can reduce the quality of the deposited oxide, and its effectiveness as a electrical insulator. Thus, the concentration of the Si—OH bonds are reduced by annealing (i.e., curing) the silicon oxide layer following the deposition.

The post deposition anneal of the deposited silicon oxide layer at block 170 may be done in a single step, or multiple steps. A single step anneal may be done, for example, by heating the deposited layer to about 300° C. to about 1,000° C. (e.g., about 600° C. to about 900° C.) in a substantially dry atmosphere (e.g., dry nitrogen, helium, argon, etc.). The anneal removes moisture from the deposited layer and converts Si—OH groups into silicon oxide. The annealed silicon oxide layer has improved film quality and improved qualities as a dielectric (e.g., a k-value approaching or equal to pure silicon dioxide).

In addition to wet and dry thermal annealing, other annealing and/or curing techniques (alone or in combination) may be used to cure the silicon oxide layer. These curing techniques which may be used also include ultraviolet (UV) cure, e-beam cure, thermal cure and microwave cure. Techniques such as UV cure may require increased temperatures, such as a temperature between 200° C. and 600° C. These curing techniques can be performed using parameters such as time, intensity, temperature and exposure which are well known in the art.

Exemplary UV cure process conditions that may be used include a chamber pressure of between about 0.5 Torr and about 8 Torr and a substrate support temperature of between about 20° C. and about 550° C., such as between about 400° C. and about 480° C. The substrate support temperature for the UV cure process may be greater than, less than or equal to the substrate support temperature during the deposition process.

The UV cure process may use a processing gas comprising an inert gas, a nitrogen-containing gas, a hydrogen gas, or combinations thereof, which may be introduced into the chamber at a flow rate of between about 500 sccm and about 50,000 sccm during the treatment, such as about 16,000 sccm. Exemplary gases include He, $H_2$, $N_2$, Ar and combinations thereof. The processing gas may be flowed into the chamber for a period of time such as between about 1 second and about 2 hours, such as between about 1 second and about 10 minutes. The UV radiation may be provided by any UV source, such as mercury microwave arc lamps, pulsed xenon flash lamps, or high-efficiency UV light emitting diode arrays. The UV radiation may have a wavelength of, for example, between about 170 nm and about 400 nm. The UV radiation may have a single wavelength, such as 173 nm. Alternatively, the UV radiation may be provided by a broad band UV source that provides wavelengths greater than 200 nm. The treatment may comprise exposing the deposited material to between about 1 Watt/$cm^2$ and about 1,000 Watts/$cm^2$ of ultraviolet radiation, and the ultraviolet radiation may provide a photon energy (electronVolts) between about 0.5 eV and about 10 eV, such as between about 1 eV and about 6 eV.

In another implementation, the low dielectric constant film is post-treated with an electron beam treatment. The e-beam treatment typically has a dose between about 50 and about 2,000 micro coulombs per square centimeter ($\mu C/cm^2$) at about 1 to 20 kiloelectron volts (keV). The e-beam treatment is typically operated at a temperature between about room-temperature and about 450° C. for about 1 minute to about 15 minutes, such as about 2 minutes. Preferably, the e-beam treatment is performed at about 400° C. for about 2 minutes. In one implementation, the e-beam treatment conditions include 4.5 kV, 1.5 mA and 150 $\mu C/cm^2$ at 400° C. Although any e-beam device may be used, one exemplary device is the EBK chamber, available from Applied Materials, Inc.

Figure 2:
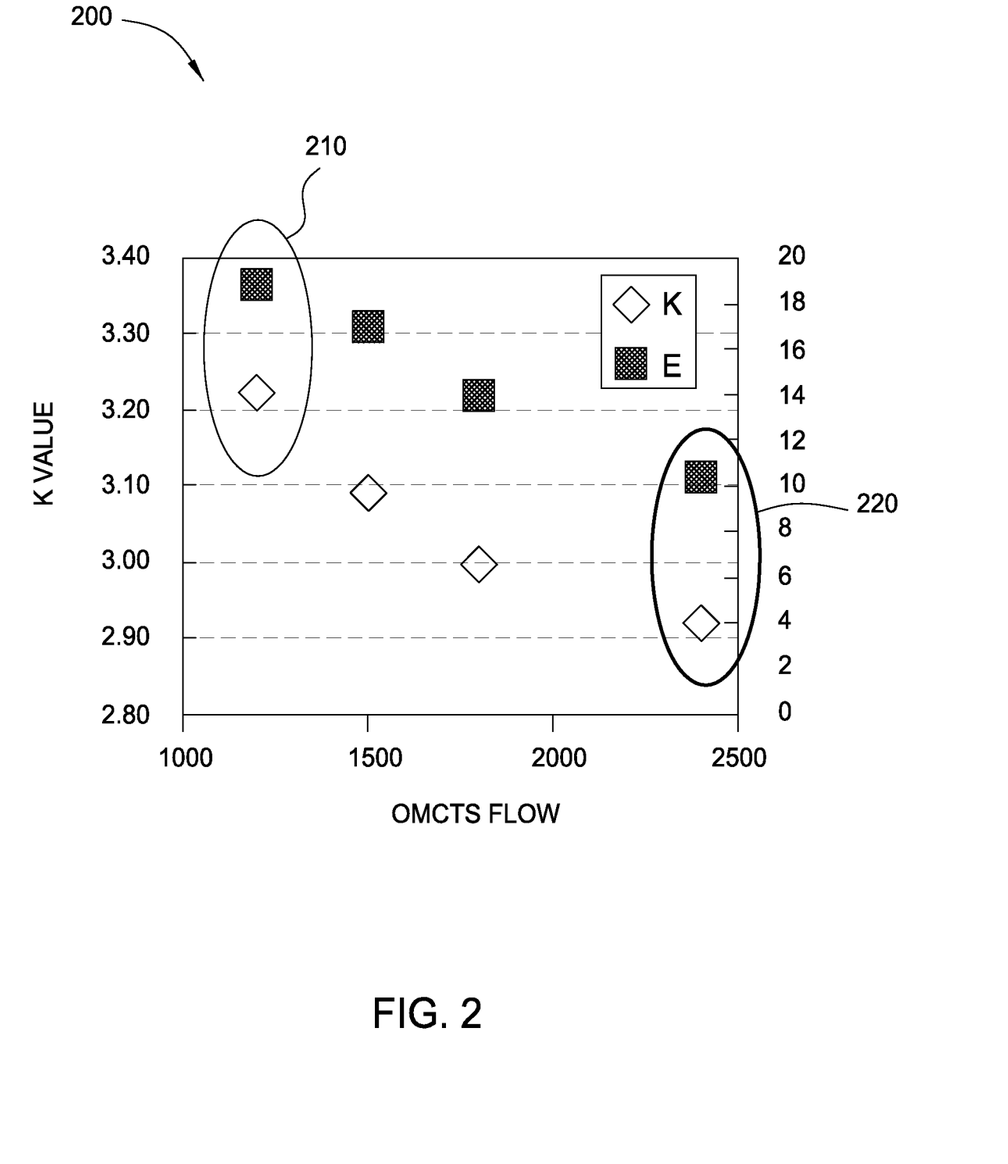
FIG. 2 is a plot illustrating the effect of OMCTS flow rate on the dielectric constant ("k") value and the modulus of a dielectric film deposited according to implementations described herein.

FIG. 2 is a plot 200 illustrating the effect of OMCTS flow rate on the k value ("K") and the modulus ("E") of a dielectric film deposited according to implementations described herein. The x-axis of the plot represents the OMCTS flow rate, the left y-axis represents the k-value of the deposited silicon oxide film and the right y-axis represents the modulus in gigapascals (GPa) of the deposited silicon oxide film. The silicon oxide films of plot 200 were formed using a flow rate of 600 sccm of TMOS and the OMCTS flow rates as depicted on the x-axis. As depicted in FIG. 2, both the k-value and the modulus of the deposited silicon oxide films decreased as the flow rate of OMCTS increased.

At an OMCTS flow rate of approximately 1,200 sccm the film was deposited at a deposition rate of approximately 6,700 Å/minute. The deposited film had a k-value and modulus as depicted by oval 210, a refractive index (RI) of 1.392, and was not very flowable. OMCTS doping indeed increased the modulus to approximately 20 GPa while maintaining the k-value at 3.2. However, at an OMCTS flow rates less than 600 sccm, the film may not be very flowable.

At an OMCTS flow rate of approximately 2,400 sccm the film was deposited at a deposition rate of approximately 9,000 Å/minute. The deposited film had a k-value and modulus as depicted by oval 220, a refractive index (RI) of 1.392, and was flowable.

Figure 3:
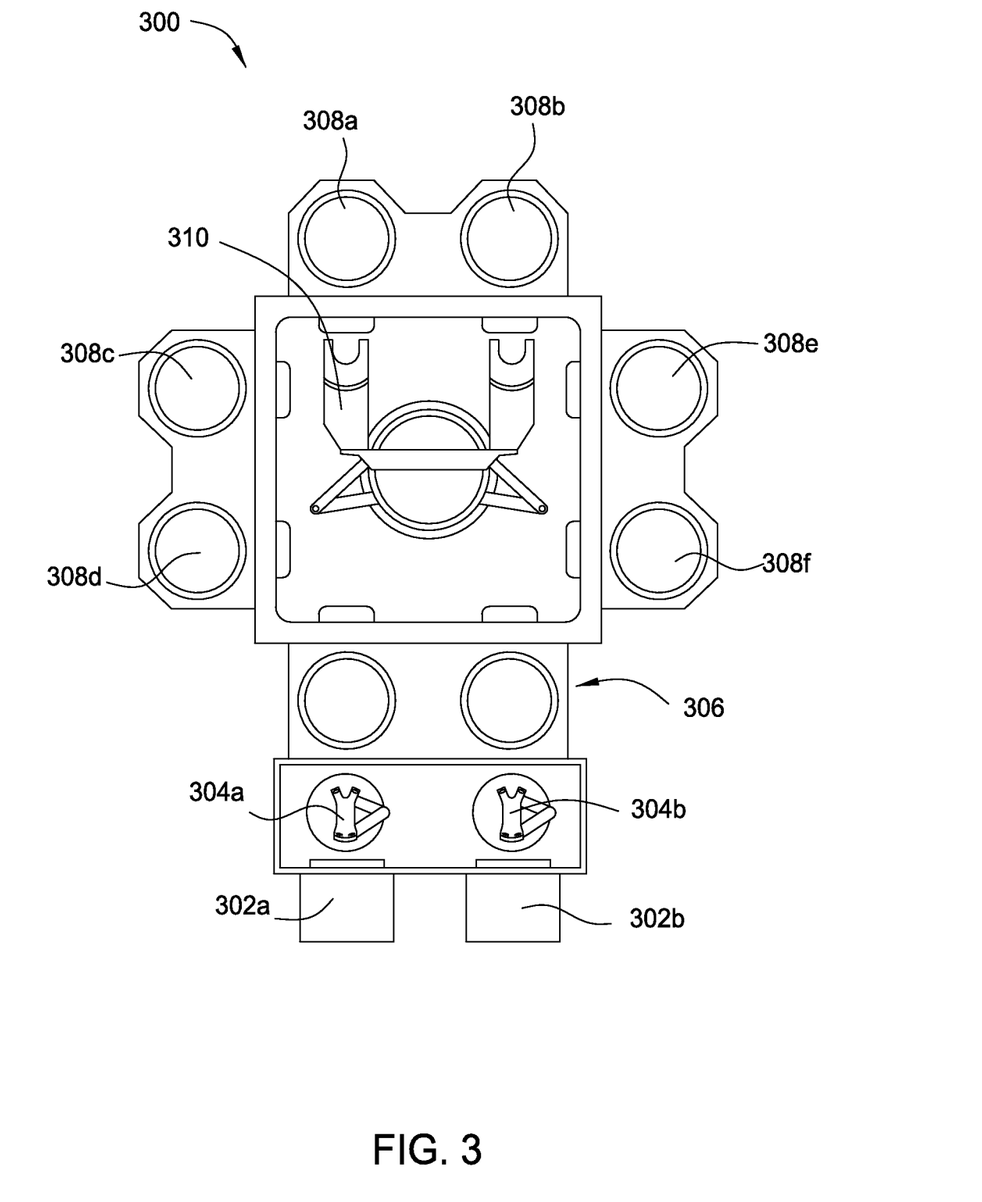
FIG. 3 is a schematic view of a system including deposition and curing chambers that may be used to practice the implementations described herein.

FIG. 3 is a schematic view of a system 300 including deposition and curing chambers that may be used to practice the implementations described herein. In FIG. 3, a pair of FOUPs (front opening unified pods) 302a, 302b supply substrates (e.g., 300 mm diameter wafers) that are received by robotic arms 304a, 304b and placed into a low pressure holding area 306 before being placed into one of the processing chambers 308a-f. A second robotic arm 310 may be used to transport the substrate wafers from the holding area 306 to the processing chambers 308a-f and back.

The processing chambers 308a-f may include one or more system components for depositing, annealing, curing and/or etching a flowable dielectric film on the substrate wafer. In one configuration, two pairs of the processing chamber (e.g., 308c-d and 308e-f) may be used to deposit the flowable dielectric material on the substrate, and the third pair of processing chambers (e.g., 308a-b) may be used to anneal the deposited dielectric. In another configuration, the same two pairs of processing chambers (e.g., 308c-d and 308e-f) may be configured to both deposit and anneal a flowable dielectric film on the substrate, while the third pair of processing chambers (e.g., 308a-b) may be used for UV or E-beam curing of the deposited film. In still another configuration, all three pairs of processing chambers (e.g., 308a-f) may be configured to deposit and cure a flowable dielectric film on the substrate. In yet another configuration, two pairs of processing chambers (e.g., 308c-d and 308e-f) may be used for both deposition and UV or E-beam curing of the flowable dielectric, while a third pair of processing chambers (e.g. 308a-b) may be used for annealing the dielectric film. It will be appreciated, that additional configurations of deposition, annealing and curing chambers for flowable dielectric films are contemplated by system 300.

In addition, one or more of the processing chambers 308a-f may be configured as a wet treatment chamber. These process chambers include heating the flowable dielectric film in an atmosphere that includes moisture. Thus, in some implementations of the system 300, processing chamber 308a-b are wet treatment chambers and processing chambers 308c-d are annealing processing chambers for performing both wet and dry anneals on the deposited dielectric film.

Figure 4:
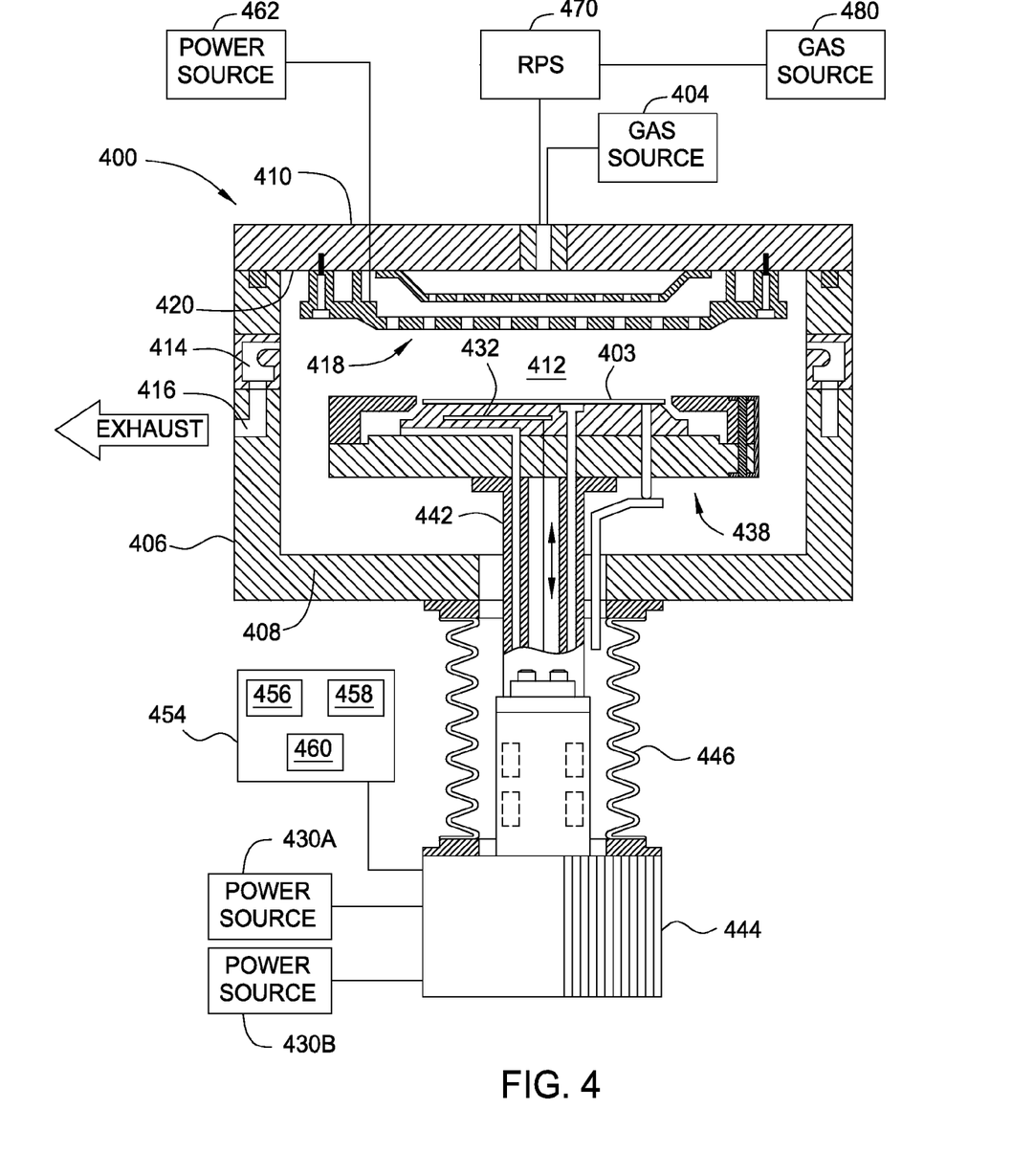
FIG. 4 is a cross-sectional schematic view of an exemplary deposition chamber that may be used to practice the implementations described herein.

FIG. 4 is a cross-sectional schematic view of an exemplary PECVD deposition chamber 400 that may be used to practice the implementations described herein. Deposition chambers that may be adapted to perform the carbon layer deposition methods described herein is the PRODUCER® chemical vapor deposition chamber, both available from Applied Materials, Inc. located in Santa Clara, Calif. It is to be understood that the chamber described below is an exemplary implementation and other chambers, including chambers from the same or other manufacturers, may be used with or modified to match implementations of this disclosure without diverging from the inventive characteristics described herein.

The deposition chamber 400 may be part of a processing system (not shown) that includes multiple processing chambers connected to a central transfer chamber (not shown) and serviced by a robot (not shown). The deposition chamber 400 includes walls 406, a bottom 408, and a lid assembly 410 that define a process volume 412. The walls 406 and bottom 408 can be fabricated from a unitary block of aluminum. The deposition chamber 400 may also include a pumping ring 414 that fluidly couples the process volume 412 to an exhaust port 416 as well as other pumping components (not shown).

A substrate support assembly 438, which may be heated, may be centrally disposed within the deposition chamber 400. The substrate support assembly 438 supports a substrate 403 during a deposition process. The substrate support assembly 438 generally is fabricated from aluminum, ceramic or a combination of aluminum and ceramic, and includes at least one bias electrode 432.

A vacuum port may be used to apply a vacuum between the substrate 403 and the substrate support assembly 438 to secure the substrate 403 to the substrate support assembly 438 during the deposition process. The bias electrode 432 may be, for example, the bias electrode 432 disposed in the substrate support assembly 438, and coupled to a bias power source 430A and 430B, to bias the substrate support assembly 438 and substrate 403 positioned thereon to a predetermined bias power level while processing.

The bias power source 430A and 430B can be independently configured to deliver power to the substrate 403 and the substrate support assembly 438 at a variety of frequencies, such as a frequency between about 1 and about 60 MHz. Various permutations of the frequencies described here can be employed without diverging from the implementations described herein.

Generally, the substrate support assembly 438 is coupled to a stem 442. The stem 442 provides a conduit for electrical leads, vacuum and gas supply lines between the substrate support assembly 438 and other components of the deposition chamber 400. Additionally, the stem 442 couples the substrate support assembly 438 to a lift system 444 that moves the substrate support assembly 438 between an elevated position (as shown in FIG. 4) and a lowered position (not shown) to facilitate robotic transfer. Bellows 446 provides a vacuum seal between the process volume 412 and the atmosphere outside the deposition chamber 400 while facilitating the movement of the substrate support assembly 438.

The lid assembly 410 may be coupled to gas source 404 for supplying process and other gases to the deposition chamber 400. The showerhead 418 may generally be coupled to an interior side 420 of the lid assembly 410. Gases (i.e., process and other gases) that enter the deposition chamber 400 pass through the showerhead 418 and into the deposition chamber 400. The showerhead 418 may be configured to provide a uniform flow of gases to the deposition chamber 400. Uniform gas flow is desirable to promote uniform layer formation on the substrate 403. A plasma power source 462 may be coupled to the showerhead 418 to energize the gases through the showerhead 418 towards substrate 403 disposed on the substrate support assembly 438. The plasma power source 462 may provide RF power. Further, the plasma power source 462 can be configured to deliver power to the showerhead 418 at a variety of frequencies, such as a frequency between about 100 MHz and about 200 MHz. In one implementation, the plasma power source 462 is configured to deliver power to the showerhead 418 at a frequency of 162 MHz.

A remote plasma source 470 may be coupled with the lid assembly 410. The remote plasma source 470 may be a compact, self-contained unit that can be conveniently mounted on the lid assembly 410 and be easily retrofitted onto existing chambers without costly and time-consuming modifications. The remote plasma source 470 utilizes a low-field toroidal plasma to dissociate a process gas. The remote plasma source 470 is coupled with a gas source 480 for supplying a process gas to the remote plasma source 470. In one implementation, the plasma dissociates a process gas including an oxygen containing gas such as $O_2$ and a carrier gas such as argon to generate atomic oxygen which is used to deposit the flowable films described herein.

The function of the deposition chamber 400 can be controlled by a computing device 454. The computing device 454 may be one of any form of general purpose computer that can be used in an industrial setting for controlling various chambers and sub-processors. The computing device 454 includes a computer processor 456. The computing device 454 includes memory 458. The memory 458 may include any suitable memory, such as random access memory, read only memory, flash memory, hard disk, or any other form of digital storage, local or remote. The computing device 454 may include various support circuits 460, which may be coupled to the computer processor 456 for supporting the computer processor 456 in a conventional manner. Software routines, as required, may be stored in the memory 458 or executed by a second computing device (not shown) that is remotely located.

The computing device 454 may further include one or more computer readable media (not shown). Computer readable media generally includes any device, located either locally or remotely, which is capable of storing information that is retrievable by a computing device. Examples of computer readable media useable with implementations of the present disclosure include solid state memory, floppy disks, internal or external hard drives, and optical memory (CDs, DVDs, BR-D, etc). In one implementation, the memory 458 may be the computer readable media. Software routines may be stored on the computer readable media to be executed by the computing device.

The software routines, when executed, transform the general purpose computer into a specific process computer that controls the chamber operation so that a chamber process is performed. Alternatively, the software routines may be performed in hardware as an application specific integrated circuit or other type of hardware implementation, or a combination of software and hardware.

While the foregoing is directed to implementations of the present disclosure, other and further implementations of the disclosure may be devised without departing from the basic scope thereof, and the scope thereof is determined by the claims that follow.

The invention claimed is:

1. A method of depositing a silicon oxide layer on a substrate, comprising:
   introducing a cyclic organic siloxane precursor and an aliphatic organic siloxane precursor into a deposition chamber;

reacting the cyclic organic siloxane precursor and the aliphatic organic siloxane precursor with atomic oxygen to form the silicon oxide layer on the substrate positioned in the deposition chamber,
wherein the substrate is maintained at a temperature between about 0° C. and about 200° C. as the silicon oxide layer is formed,
wherein the silicon oxide layer is initially-flowable following deposition, and
wherein a ratio of a flow rate of the cyclic organic siloxane precursor to a flow rate of the aliphatic organic siloxane precursor is from about 2:1 to 6:1; and
curing the deposited silicon oxide layer, wherein the cured silicon oxide layer has a dielectric constant of less than 4.0 and a modulus of about 10 GPa or greater.

2. The method of claim 1, wherein the flow rate of the cyclic organic siloxane precursor is from about 1,000 sccm to about 2,500 sccm, wherein the substrate has a 300 mm diameter or less.

3. The method of claim 2, wherein the flow rate of the aliphatic organic siloxane precursor is from about 100 sccm to about 3,000 sccm, wherein the substrate has a 300 mm diameter or less.

4. The method of claim 3, wherein the cyclic organic siloxane precursor is octamethylcyclotetrasiloxane (OMCTS) and the aliphatic organic siloxane precursor is tetramethylorthosilicate (TMOS).

5. The method of claim 1, wherein the dielectric constant is less than about 3.2 and the modulus is approximately 20 GPa.

6. A method of depositing a silicon oxide layer on a substrate, comprising:
generating atomic oxygen outside a deposition chamber and introducing the atomic oxygen into the deposition chamber;
introducing a cyclic organic siloxane precursor and an aliphatic organic siloxane precursor into the deposition chamber, wherein the cyclic organic siloxane precursor and the aliphatic organic siloxane precursor are mixed with the atomic oxygen within the deposition chamber;
reacting the cyclic organic siloxane precursor, the aliphatic organic siloxane precursor and the atomic oxygen to form the silicon oxide layer on the substrate positioned in the deposition chamber,
wherein the substrate is maintained at a temperature between about 0° C. and about 200° C. as the silicon oxide layer is formed,
wherein the silicon oxide layer is initially-flowable following deposition, and
wherein a ratio of a flow rate of the cyclic siloxane precursor to a flow rate of the aliphatic siloxane precursor is from about 2:1 to 6:1; and
curing the deposited silicon oxide layer, wherein the cured silicon oxide layer has a dielectric constant of less than 4.0 and a modulus of about 10 GPa or greater.

7. The method of claim 6, wherein the flow rate of the cyclic organic siloxane precursor is from about 1,000 sccm to about 2,500 sccm, wherein the substrate has a 300 mm diameter or less.

8. The method of claim 6, wherein the cyclic organic siloxane precursor is octamethylcyclotetrasiloxane (OMCTS) and the aliphatic organic siloxane precursor is tetramethylorthosilicate (TMOS).

9. The method of claim 6, wherein the substrate comprises a silicon wafer having a diameter of about 300 mm or less.

10. The method of claim 6, wherein a plurality of structures are formed on a surface of the substrate, wherein the structures include gaps and trenches having a height to width aspect ratios of 6:1 or more.

11. The method of claim 6, wherein the atomic oxygen is formed by:
forming a plasma from a gas mixture comprising argon; and
introducing an oxygen precursor to the plasma, wherein the oxygen precursor dissociates to form the atomic oxygen.

12. The method of claim 11, wherein the oxygen precursor is selected from the group consisting of molecular oxygen, ozone and nitrogen dioxide.

13. The method of claim 6, wherein the cyclic organic siloxane precursor is selected from the group consisting of: octamethyltrisiloxane (OMTS), octamethylcyclotetrasiloxane (OMCTS), tetramethylcyclotetrasiloxane (TMCTS) and combinations thereof.

14. The method of claim 6, wherein the aliphatic organic siloxane precursor is selected from the group consisting of: tetramethylorthosilicate (TMOS), tetraethylorthosilicate (TEOS), trimethylmethoxysilane (TMMOS), tetramethyldimethyldimethoxydisilane, dimethyldimethoxysilane (DMDMOS), dimethyldiethoxysilane (DMDEOS), diethoxymethylsilane (DEMS), methyl triethoxysilane (MTEOS), methyl trimethoxysilane (MTMOS), and combinations thereof.

15. The method of claim 6, wherein the cyclic organic siloxane precursor and the aliphatic organic siloxane precursor are mixed with a carrier gas comprising helium.

16. The method of claim 6, wherein the deposition chamber has a pressure of about 0.5 Torr to about 3 Torr as the silicon oxide layer is formed.

17. The method of claim 6, wherein the silicon oxide layer is formed at a rate of about 2,000 Å/min to about 10,000 Å/min.

18. The method of claim 6, wherein the dielectric constant is less than about 3.2 and the modulus is approximately 20 GPa.

19. The method of claim 6, wherein the generating atomic oxygen outside the deposition chamber comprises:
striking a plasma from argon; and
introducing an oxygen precursor to the plasma to generate the atomic oxygen.

* * * * *